United States Patent [19]
Eldridge

[11] Patent Number: 6,121,131
[45] Date of Patent: Sep. 19, 2000

[54] METHOD FOR FORMING CONDUCTIVE STRUCTURES

[75] Inventor: Jerome Eldridge, Los Gatos, Calif.

[73] Assignee: Micron Technology, Inc., Boise, Id.

[21] Appl. No.: 09/385,579

[22] Filed: Aug. 31, 1999

[51] Int. Cl.$^7$ .............................................. H01L 21/4763
[52] U.S. Cl. ........................ 438/624; 438/622; 438/619; 438/618; 257/276
[58] Field of Search .................................... 438/624, 622, 438/618, 619, 411; 257/276, 374; 252/188.26; 526/136

[56] References Cited

U.S. PATENT DOCUMENTS

| | | | |
|---|---|---|---|
| 3,376,107 | 4/1968 | Oka et al. .................................. | 23/204 |
| 3,776,855 | 12/1973 | Raymond et al. ................... | 252/301.1 |
| 3,954,523 | 5/1976 | Magdo et al. . | |
| 4,451,445 | 5/1984 | Cheng et al. ............................ | 423/645 |
| 4,470,847 | 9/1984 | Hard et al. ................................ | 75/84.4 |
| 4,728,507 | 3/1988 | Worcester ............................... | 423/645 |
| 5,023,200 | 6/1991 | Blewer et al. . | |
| 5,408,742 | 4/1995 | Zaidel et al. . | |
| 5,461,003 | 10/1995 | Havemann et al. ..................... | 437/187 |
| 5,470,801 | 11/1995 | Kapoor et al. . | |
| 5,494,860 | 2/1996 | McDevitt et al. ....................... | 437/246 |
| 5,530,418 | 6/1996 | Hsu et al. ................................ | 338/307 |
| 5,562,154 | 10/1996 | Benson et al. . | |
| 5,593,926 | 1/1997 | Fujihira . | |
| 5,723,368 | 3/1998 | Cho et al. ............................... | 437/763 |
| 5,960,311 | 9/1999 | Sing et al. ............................... | 438/623 |
| 6,008,540 | 12/1999 | Lu et al. .................................. | 257/758 |
| 6,035,530 | 5/1999 | Hong ........................................ | 29/885 |
| 6,045,938 | 4/2000 | Winsel et al. ............................ | 429/60 |

OTHER PUBLICATIONS

Anand et al. "NURA A feasible gas–dielectric interconnect process" Symp. on vlsi technology IEEE Jun. 1996 pp. 82–83.

Watanabe et al. "A Novel stacked capacitor with porous–Si . . ."Symp.on vlsi technology–IEEE May 1993 pp. 17–18.
Anand et al., "NURA: A Feasible, Gas–Dielectric Interconnect Process," *1996 Sympos. On VLSI Technology, Digest of Technical Papers*, IEEE, pp. 82–83, Jun. 11–13 1996.
Anand et al., "Use of Gas as Low–k Interlayer Dielectric in LSI's: Demonstration of Feasibility," *IEEE Transactions On Electron Dev.*, 44(11): 1965–1971 (1997).
Anderson et al., "Porous Polycrystalline Silicon: A New Material for MEMS," *J. Microelectromechanical Systems*, 3(1): 10–18 (1994).
"Dimensionally Stable Metal Hydrides," http://irmsrv02.srs.gov/general/sci–tech/core–technologies/tech–transfer/metal–hydrides.html, 2 pgs., (updated Jul. 13, 1998; accessed Dec. 7, 1999).
Kubaschewski et al., "Oxidation of Metals and Alloys," $2^{nd}$ Ed., London, Butterworths, pp. 1–319 (1962).
"REB Research & Consulting Web Site," http://www.rebresearch.com/, 17 pgs., (portions updated Feb. 1999; accessed Dec. 7, 1999).
Togo et al., "A Gate–side Air–gap Structure (GAS) to Reduce the Parasitic Capacitance in MOSFETs," *1996 Sympos. On VLSI Technology, Digest of Technical Papers*, IEEE, pp. 38–39, Jun. 11–13 1996.
Watanabe et al., "A Novel Stacked Capacitor with Porous–Si Electrodes for High Density DRAMs" *1993 Sympos. On VLSI Technology, Digest of Technical Papers*, IEEE, pp. 17–18, May 17–19 1993.

*Primary Examiner*—Matthew Smith
*Assistant Examiner*—Granvill D Lee, Jr.
*Attorney, Agent, or Firm*—Mueting, Raasch & Gebhardt, P.A.

[57] ABSTRACT

Conductive structures and methods for preparing conductive structures are provided. Conductive structures according to the present invention can be prepared by controllably deforming and shaping a metal layer by using a hydrogen gas source and thermally treating the hydrogen gas source.

64 Claims, 4 Drawing Sheets

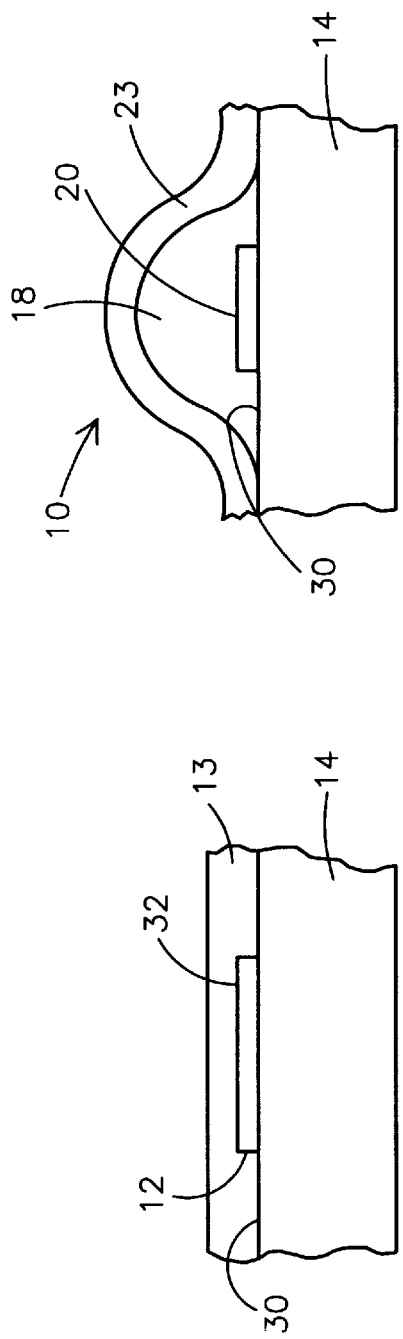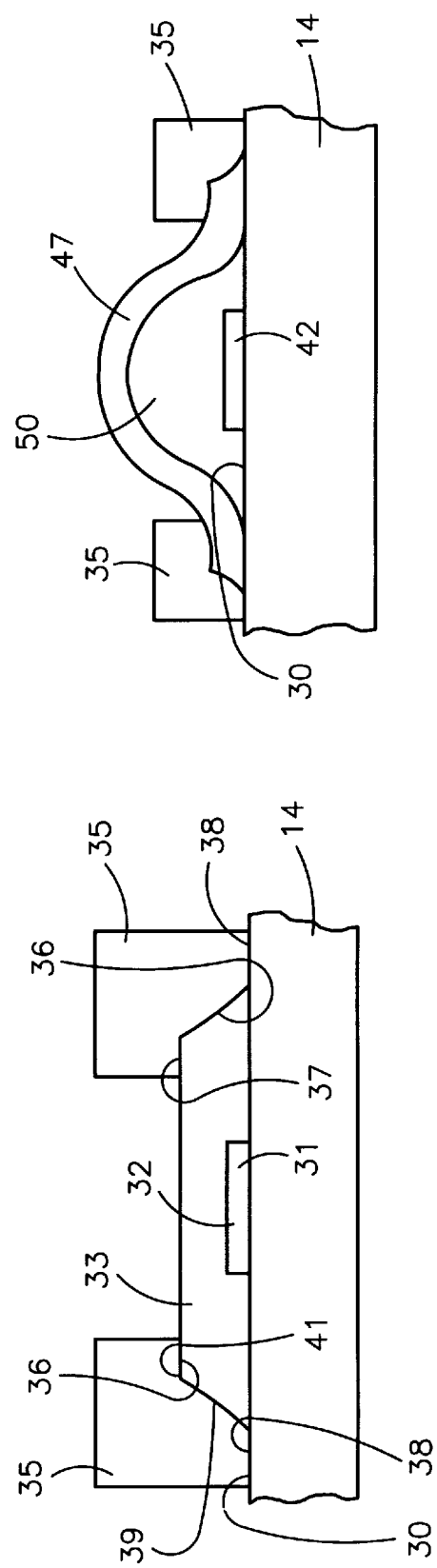

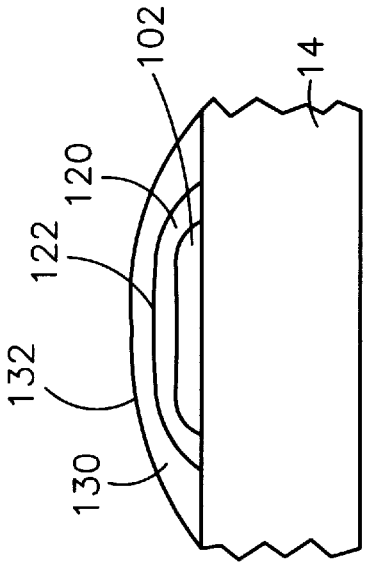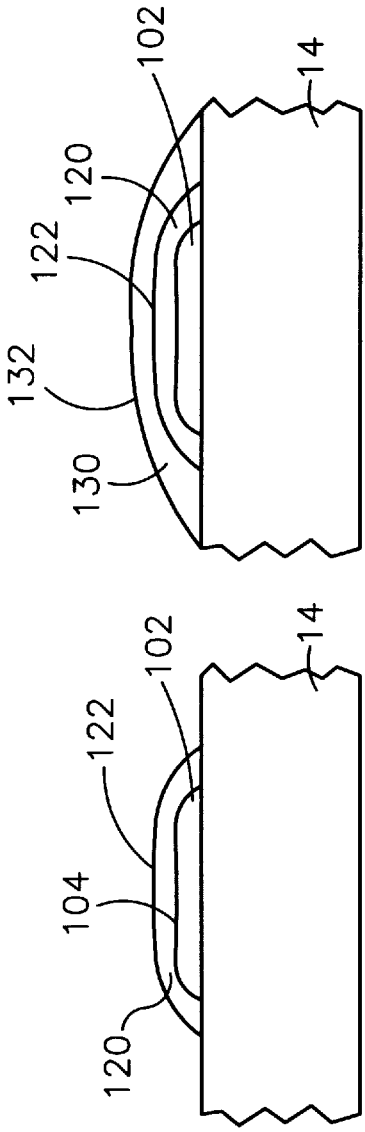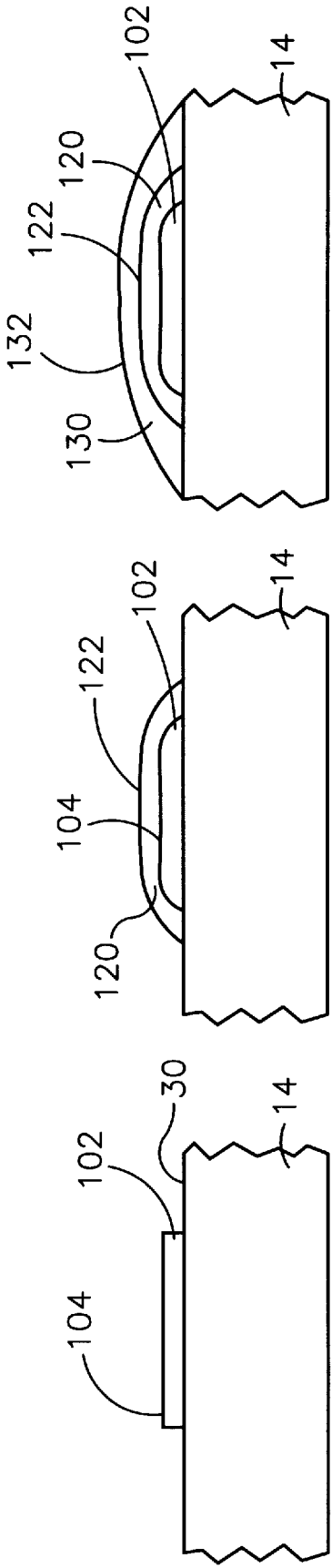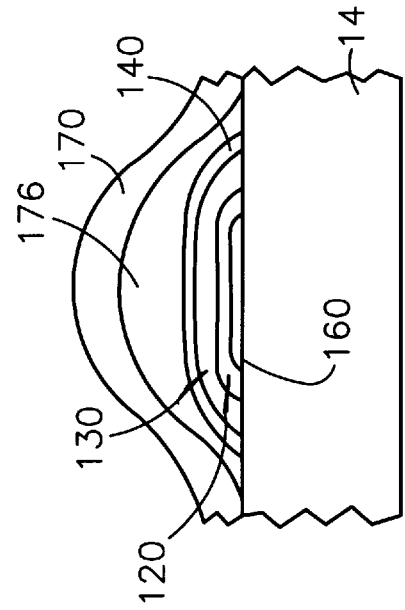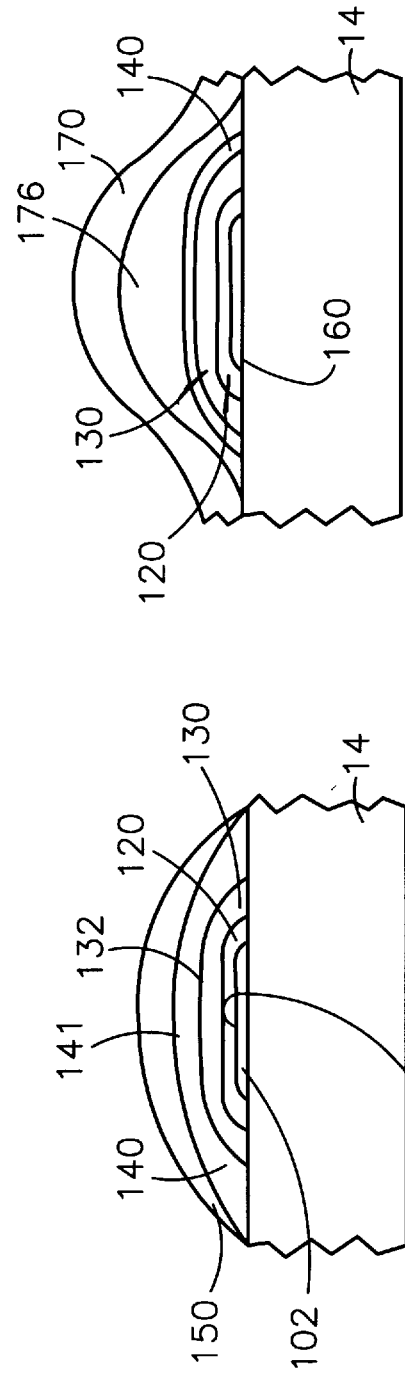

METHOD FOR FORMING CONDUCTIVE STRUCTURES

FIELD OF THE INVENTION

The present invention relates to the formation of conductive structures. More particularly, the present invention pertains to deformation of one or more metal layers to form such conductive structures.

BACKGROUND OF THE INVENTION

Various manners of fabricating a diverse and wide range of structures are available. Particularly, a wide variety of techniques are available for forming conductive structures of integrated circuits. For example, various photolithography and etching techniques are known, various methods of micromachining silicon devices is known, etc. However, there is always a need for additional novel approaches for forming such structures.

Dimensions in integrated circuits are constantly being reduced. For example, the separation between conductive layers is being reduced to achieve smaller integrated circuits. With a reduction in the spacing between conductive materials in an integrated circuit, an increase in capacitive crosstalk is observed. Conventional integrated circuits typically utilize interconnect structures wherein a first metal line is separated from a second metal line by an insulative material. If the capacitive effects between the first metal line and the second metal line is high, i.e., a voltage on one effects a voltage on the other, then the capacitive effects may lead to an inoperable integrated circuit.

To reduce such capacitive coupling or to provide isolation in integrated circuits, low dielectric constant materials have been utilized between such conductive materials or lines. However, use of low dielectric constant materials have many associated problems. For example, equipment is not always available to properly process new low dielectric materials in various integrated circuits. Further, for example, such dielectric materials may not properly or adequately reduce such capacitive coupling between the conductive materials.

A void region or space may also serve as a dielectric and offers the lowest possible dielectric constant, having a value equal to 1. It is noted that a void space can comprise a vacuum, but typically comprises some gases. A void space can alternatively be referred to as a free space, i.e., space that is empty of materials in a solid or liquid phase. It would be desirable to develop methods of forming void regions for use as low dielectric regions, such as for isolation in semiconductor constructions.

SUMMARY OF THE INVENTION

The present invention provides a method for forming a conductive structure, e.g., a conductive structure over a void region. The method involves controlled deformation and shaping of a metal layer employing a hydrogen gas source and thermal treatment of the source. The hydrogen gas source is preferably a hydrogen containing metal layer. Upon thermal heating, hydrogen gas evolves from the hydrogen containing metal layer and creates a pressure that exerts force sufficient to produce deformation in another metal layer. In other words, temperature, pressure and time along with differences in hydrogen solubility and diffusivity between different metal layers are used to form conductive structures. For example, release of hydrogen from a hydrogen containing metal layer is used to controllably deform an overlying metal layer.

For example, using the present invention, conductive metals can be shaped and/or supported over a void region. The present invention provides a method to prepare a diverse and wide range of structures that may be used for various applications, e.g., interconnections in integrated circuits, for transistor and packaging technologies, switching arrays, micromachined silicon devices, microchannels for fluid transport and bulk material deformation applications.

Accordingly, the present invention provides a method for forming a conductive structure by providing a substrate assembly having a surface. At least one hydrogen containing first metal layer (e.g., patterned or unpatterned layer) is formed on the substrate assembly surface. A second metal layer is formed on at least a portion of the first metal layer and at least the first metal layer is thermally treated to deform at least a portion of the second metal layer.

In one embodiment of the method, the method includes thermally treating at least the first metal layer to deform at least a portion of the second metal layer by a diffusion of hydrogen gas out of the hydrogen containing first metal layer. In another embodiment of the method, the formation of the at least one hydrogen containing first metal layer includes forming a layer of at least one high hydrogen solubility metal and incorporating hydrogen in the high hydrogen solubility metal layer. Preferably, the formation of the at least one hydrogen containing first metal layer includes forming a metal hydride layer.

Further, in other embodiments of the invention, the method provides incorporation of hydrogen into the high hydrogen solubility metal layer by diffusion through the second metal layer. Alternatively, the incorporation of hydrogen into the high hydrogen solubility metal layer is accomplished by exposing the high hydrogen solubility metal layer to a hydrogen atmosphere.

Preferably, the high hydrogen solubility metal employed in the method is at least one metal typically selected from the group of titanium, zirconium, thorium, hafnium, vanadium, niobium, tantalum, lanthanum, cerium, and palladium. Additionally, the high hydrogen solubility metal may have a hydrogen permeability of about 4 or more orders of magnitude greater than a hydrogen permeability of the low hydrogen solubility metal. Preferably, the low hydrogen solubility metal is at least one metal typically selected from the group of copper, silver, gold, tungsten, platinum, aluminum, molybdenum, iron and nickel.

The present invention further provides a method for forming a conductive structure by providing a substrate assembly having a surface; forming at least one hydrogen containing first metal layer on the substrate assembly surface; forming a second metal layer on at least a portion of the first metal layer; providing a clamping structure positioned over at least a portion of the second metal layer; and thermally treating at least the first metal layer to deform at least a portion of the second metal layer. In one embodiment of the method, the method includes providing a clamping structure positioned on at least a portion of a perimeter of the second metal layer. In another embodiment, the method also provides a mold, e.g., a heated mold, positioned over at least a portion of the second metal layer.

The invention also provides a method for forming a void region associated with a substrate assembly by providing a substrate assembly having a surface; forming at least one hydrogen containing first metal layer on the substrate assembly surface; forming a second metal layer on at least a portion of the first metal layer; and thermally treating at least the first metal layer to define a void between at least a portion of the substrate assembly surface and a portion of the second metal layer.

Also provided is a method for forming a conductive structure by providing a substrate assembly having a surface; forming at least one hydrogen containing first metal layer on at least a portion of the substrate assembly surface; oxidizing at least a portion of the at least one hydrogen containing first metal layer resulting in an oxidized layer; forming a second metal layer on at least a portion of the oxidized layer; and thermally treating at least the first metal layer to deform at least a portion of the second metal layer. For example, oxidizing at least a portion of the hydrogen containing first metal layer may result in an oxidized layer having a thickness of about 1 angstrom to about 20 angstroms.

In one embodiment of this method, the method further includes forming a carbon layer on at least a portion of the oxidized layer. For example, formation of the carbon layer typically results in a carbon layer having a thickness of about 1 angstrom to about 25 angstroms.

In another embodiment of the method, the method includes forming a seed metal layer of a low hydrogen solubility metal on the oxidized layer. The method may further include electrodepositing the low hydrogen solubility metal on the seed metal layer. Additionally, formation of the second metal layer may also include forming a seed metal layer of a low hydrogen solubility metal on the oxidized layer.

The invention also provides a conductive structure, wherein the conductive structure contains a substrate assembly having a surface; a high hydrogen solubility metal on at least a portion of the substrate assembly surface; and a raised conductive region comprising a low hydrogen solubility metal. At least a portion of the high hydrogen solubility metal and low hydrogen solubility metal are separated by a void region.

BRIEF DESCRIPTION OF THE DRAWINGS

FIGS. 1A–1B are diagrammatic views generally illustrating the formation of a conductive structure according to the present invention.

FIGS. 2A–2B are diagrammatic views illustrating one embodiment of the method generally illustrated in FIGS. 1A–1B for forming a conductive structure using a clamping structure according to the present invention.

FIGS. 4A–4E are diagrammatic views illustrating various other embodiments of the method generally illustrated in FIGS. 1A–1B for forming conductive structures using a technique for reducing adhesion characteristics according to the present invention.

DETAILED DESCRIPTION OF THE INVENTION

Figure 3B:
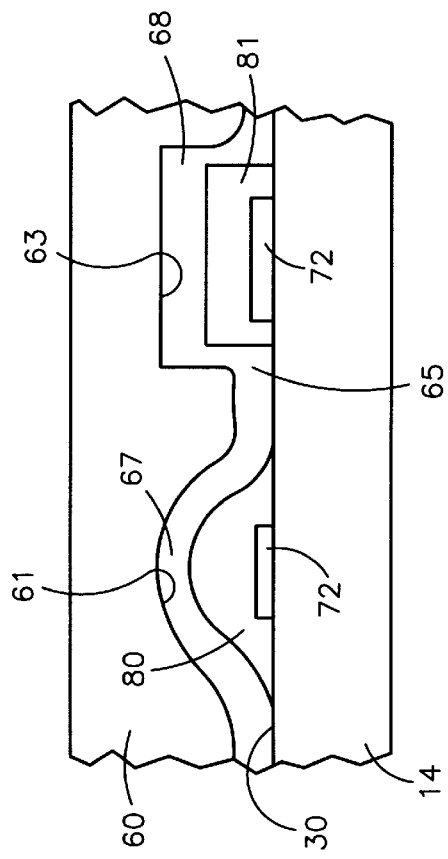
FIGS. 3A–3B are diagrammatic views illustrating other embodiments of the method generally illustrated in FIGS. 1A–1B for formation of conductive structures using a heated mold according to the present invention.

Generally, methods of forming conductive structures from certain metals having a low hydrogen solubility (e.g., copper, silver, gold, tungsten, platinum, aluminum, molybdenum, iron, nickel, lanthanum, cerium, and palladium) using certain metals having a high hydrogen solubility (e.g., titanium or titanium—vanadium alloy) shall be described with reference to FIGS. 1–6. Such methods generally use the large differences in hydrogen solubility and transport characteristics of such metals to form conductive structures.

In the following detailed description, reference is made to the accompanying figures which form a part hereof, and in which is shown by way of illustration the manner in which the invention may be practiced. These embodiments are described in sufficient detail to enable one skilled in the art to practice the present invention. It is to be understood that other embodiments may be utilized and that changes may be made without departing from the scope of the present invention as defined in the accompanying claims. Further, one skilled in the art will recognize that one or more techniques of one embodiment described herein may be used with one or more techniques of other embodiments described herein to form various combinations of the present invention.

The present invention describes a conductive structure formed relative to a substrate assembly, e.g., a surface of a wafer. It is to be understood that the term "substrate assembly," as used herein, includes any substrate or substrate supported structure, e.g., such as a semiconductor substrate or any other substrate, having one or more layers or structures formed thereon. A semiconductor substrate is to be understood as including silicone-on-sapphire (SOS) technology, silicon-on-insulator (SOI) technology, doped and undoped semiconductors, epitaxial layers of silicon supported by a base semiconductor, as well as any other semiconductor based structures known to one skilled in the art. Furthermore, when reference is made to a substrate assembly in the following description, previous process steps may have been utilized to form regions/junctions/lines, such as metalized lines, in a previously formed structure. The following detailed description is, therefore, not to be taken in a limiting sense, as the scope of the present invention is defined by the appended claims. It is further understood that the present invention is not limited to conductive structures formed relative to silicon wafer or silicon wafers having one or more materials formed thereon, but rather other types of wafers (e.g., gallium arsenide wafers) can be employed, as well as other substrates of various other materials and sizes and configurations, e.g., circuit board substrates, ceramic substrates, etc.

It will be readily apparent to one skilled in the art from the description below, that any conductive structure may be formed using the methods described herein. For example, an interconnect is one such conductive structure which can be prepared employing the present invention. An interconnect can serve to connect, in a specific configuration, multiple conductive elements of devices to form a desired circuit. For example, local interconnects, multi-level interconnect structures, etc., may benefit from a void over which the conductive structure is formed. In other words, the void may provide effective low dielectric isolation of the conductive structure from other conductive elements.

Referring now to FIGS. 1A and 1B, a method of forming a conductive structure 10 is illustrated. Conductive structure 10 is formed by providing a substrate assembly 14 having a substrate assembly surface 30. Formed on the substrate assembly surface 30 is a first metal layer 12 having a first metal layer surface 32. The first metal layer 12 is a hydrogen containing layer preferably formed of at least one high hydrogen solubility metal. The first metal layer 12 can be a patterned metal layer or an unpatterned metal layer. A "patterned" metal layer may be prepared, for example, using conventional photoliothographic techniques known in the art. As shown in FIG. 1A, first metal layer 12 is a patterned metal layer defined on a specific region of the substrate assembly surface 30. Additionally, FIG. 1A shows a second metal layer 13 formed on at least a portion of the first metal layer 12. The second metal layer 13 includes at least one low hydrogen solubility metal. The second metal layer 13 may also be optionally patterned.

The relatively large differences in the hydrogen solubility and transport characteristics of the first and second metal layers 12 and 13, formed of high and low hydrogen solubility metals, respectively (as further described below), allows for the formation of conductive structures according to the present invention. As used herein, a "high hydrogen solubility metal," is a metal that is capable of hydrogen absorption at a selected temperature and pressure. Preferably, a high hydrogen solubility metal exhibits hydrogen absorption greater than about 1000.0 cubic centimeters (cc)/100 grams of metal; more preferably in the range of about 1000.0 cc/100 grams of metal to about 50,000.0 cc/100 grams of metal. It is recognized, however, that hydrogen absorption may vary with a specific metal and will be dependent upon the temperature and hydrogen pressure that is employed.

Table 1, shown below, includes a list of certain low and high solubility metals and the respective solubility values for these metals. For example, under a pressure of approximately 1 atmosphere and at a temperature of about 400° C., approximately 38,770 cc of hydrogen will be incorporated into about 100 grams of titanium. This is unlike copper, a low hydrogen solubility metal, wherein about 0.06 cc of hydrogen will be incorporated into about 100 grams thereof under such conditions. Preferred high hydrogen solubility metals for the first metal layer 12, include, but are not limited to, titanium, zirconium, thorium, hafnium, vanadium, niobium, tantalum, lanthanum, cerium, and palladium or alloys thereof.

As used herein, "a low hydrogen solubility metal," is a metal that has a reduced ability to retain or absorb hydrogen. As shown in Table 1, the hydrogen absorption of low hydrogen solubility metals preferably is less than 20.0 cc/100 grams of metal; more preferably, the hydrogen absorption typically ranges from about 0.1 cc/100 grams of metal to about 20.0 cc/100 grams of metal. Low hydrogen solubility metals include, but are not limited to copper, silver, gold, tungsten, platinum, aluminum, molybdenum, iron and nickel or alloys thereof. Although hydrogen solubility may increase in the low hydrogen solubility metals with an increase in temperature, the solubility in the metal remains relatively low as indicated in Table 1 by the range of hydrogen absorption. As with the high hydrogen solubility metals, the solubility of hydrogen in a specific metal may vary as a function of temperature and hydrogen pressure.

TABLE 1

| | Low Hydrogen Solubility Metals* | | | | High Hydrogen Solubility Metals* | | | |
|---|---|---|---|---|---|---|---|---|
| ° C. | Ni | Cu | Ag | Mo | Ti | V | Zr | Ta |
| 20 | | | | | 40,700 | 15,000 | 23,600 | 46,000 |
| 400 | 3.2 | 0.06 | 0.06 | 0.17 | 38,770 | 3,800 | | 2,500 |
| 500 | 4.1 | 0.16 | 0.11 | 0.18 | 36,600 | 1,900 | | 1,400 |
| 600 | 5.3 | 0.3 | | 0.18 | 33,470 | 1,000 | 18,400 | 700 |

TABLE 1-continued

| | Low Hydrogen Solubility Metals* | | | | High Hydrogen Solubility Metals* | | | |
|---|---|---|---|---|---|---|---|---|
| ° C. | Ni | Cu | Ag | Mo | Ti | V | Zr | Ta |
| 800 | 7.8 | 0.7 | 0.33 | 0.25 | 14,100 | 440 | 16,500 | 250 |
| 1000 | 9.8 | 1.6 | | 0.50 | 6,610 | 250 | 7,800 | 140 |

*solubility values given above represent $cm^3$ $H_2$/100 grams of metal under a pressure of 1 atmosphere of hydrogen.

Table 2, shown below, illustrates the solubility of hydrogen in one particular high hydrogen solubility metal, titanium. As shown, the solubility of hydrogen in titanium is dependant upon hydrogen pressure and temperature. For example, at approximately 50 millimeters (mm) of mercury (Hg) at about 500° C., approximately 30,000 cc of hydrogen/100 g is soluable in the titanium metal. As further shown in Table 2, hydrogen solubility is relatively high in titanium even under relatively low pressures of hydrogen, e.g., 10 mm Hg. This is especially true at a temperature of about 500° C. However, the hydrogen solubility is significantly less at higher temperatures, such as 800° C. Although Table 2 is specific for titanium metal, similar hydrogen solubility characteristics will be observed for other high hydrogen solubility metals under similar conditions.

TABLE 2

| | $H_2$ Solubility (cc/100 grams) | |
|---|---|---|
| $H_2$ Pressure (in mm of Hg) | 500° C. | 800° C. |
| 10 | 20,000 | ~0 |
| 50 | 30,000 | 4000 |
| 100 | 32,000 | 7000 |
| 760 | 34,000 | 13,000 |

It is known that various high hydrogen solubility metals can absorb and retain certain amounts of hydrogen (Table 1). Titanium metal, for example, is capable of retaining the most hydrogen of the high hydrogen solubility metals. For example, bulk titanium metal, free from surface oxide and other impurity films, can absorb hydrogen very rapidly at temperatures as low as about 375° C. Hydrogen pressures on the order of about 10 mm (Hg) to about 100 mm (Hg), are typically sufficient to convert titanium metal entirely to $TiH_2$, e.g., a metal hydride layer. Once $TiH_2$ layer is formed and cooled to about room temperature, the titanium metal hydride layer will remain stable on reheating up to about 400° C. even without supplying additional hydrogen. In other words, hydrogen does not evolve from the $TiH_2$ layer at a significant rate until a hydrogen release temperature of about 400° C. is reached and/or exceeded. Thus, depending on the high hydrogen solubility metal selected, the time required for release of hydrogen from the high hydrogen solubility metal is typically less than about 10 minutes, preferably less than about 5 minutes.

Several metallurgical properties of high hydrogen solubility metals can influence their hydrogen absorption/desorption characteristics. These metallurgical properties include, for example, grain size, texture, secondary phases, impurity levels, such as oxygen, and oxide films, formed on the surface and along the boundaries of the metal grains. Additionally, metallurgical properties of thin layers of high hydrogen solubility metals will not necessarily be constant, but will be dependent on deposition rates, substrates employed, temperature, background gas pressures, etc., as well as the tools employed to provide deposition.

With use of a layer of a high hydrogen solubility metal such as titanium, hydrogen generally forms a hydrogen containing titanium layer having a typical composition of $TiH_{1.75-2}$. Generally, hydrogen solubility progressively increases with an increase in pressure but tends to decrease significantly above temperatures of about 400° C. As shown in Tables 1 and 2, increasing hydrogen pressure at a given temperature substantially increases hydrogen solubility. On the other hand, increasing the temperature at a given hydrogen pressure markedly lowers hydrogen solubility. For example, hydrogen solubility is about zero at 800° C./10 millimeters hydrogen pressure, and about 40,700 $cm^3$/100 grams of titanium at 20° C./760 millimeters hydrogen pressure, respectively. Intermediate combinations of temperature and pressure yield smaller but still quite large effects on the hydrogen solubility. Thus, the adsorption-desorption equilibria and kinetics of a high hydrogen solubility metal are process-sensitive.

Generally, the hydrogen containing first metal layer 12 is provided by forming a high hydrogen solubility metal on the substrate assembly surface 30, to a thickness, for example, of about 0.005 microns to about 0.050 microns. Optionally, as stated above, the high hydrogen solubility metal is patterned. Further, generally, hydrogen is then introduced into the high hydrogen solubility metal to form the hydrogen containing first metal layer 12, e.g., a hydrogen rich solid solution. Preferably, the first metal layer 12 is saturated with hydrogen thereby forming a metal hydride layer. However, although a hydrogen saturated first metal layer 12 is preferred, it should be clear to one of skill in the art that the first metal layer 12 need not be saturated with hydrogen. The first metal layer 12 need only incorporate therein a concentration of hydrogen effective to provide a desired deformation in the second metal layer 13 as described below. For example, a first metal layer 12 having any hydrogen concentration which is stable under ambient conditions and which when heated to a hydrogen release temperature evolves hydrogen adequate for achieving a desired deformation of the second metal layer 13 may be used.

Hydrogen may be introduced (e.g., charged or loaded) into the high hydrogen solubility metal by one of several methods. In a first preferred hydrogen loading method, a high hydrogen solubility metal is formed on the substrate assembly surface 30 and patterned. Further, as shown in FIGS. 1A and 1B, the second metal layer 13 is formed over at least the high hydrogen solubility metal and regions of substrate assembly surface 30. The second metal layer 13 preferably includes one or more low hydrogen solubility metals. If desired, the second metal layer 13 may also be patterned.

In the first hydrogen loading method, after the high hydrogen solubility metal and the second metal layer 13 are formed, they are subsequently exposed to hydrogen in situ. As used herein, "in situ," refers to the formation of a hydrogen containing first metal layer 12 on the substrate assembly surface 30 by exposing the high hydrogen solubility metal and the second metal layer 13 to hydrogen. Hydrogen is introduced into the high hydrogen solubility metal by diffusion through the second metal layer 13. The absorption of hydrogen by the high hydrogen solubility metal via diffusion through the second metal layer 13, will typically be dependant upon several factors including: the selected high and low hydrogen solubility metals, the temperature at which hydrogen is introduced, the selected hydrogen pressure and duration of hydrogen exposure. Generally, this first hydrogen loading process will be a relatively slow process due to the slow diffusion of hydrogen through the low hydrogen solubility metal of the second metal layer 13. For example, the process may require a time period in the range of about 1 minute to about 300 minutes, at a temperature of about 100° C. to about 400° C. and a pressure of about 10 millimeters to about 760 millimeters, depending on the low hydrogen solubility metal or metals selected for the second metal layer 13. However, depending on metal layer 13 and the thickness of metal layer 13, hydrogen pressures above 760 mm can be used to shorten the time period required to load metal layer 12 with the desired amount of hydrogen.

In this first hydrogen loading method, hydrogen absorption by the high hydrogen solubility metal to form the hydrogen containing first metal layer 12, typically occurs more rapidly than diffusion through the second metal layer 13, and therefore, the absorption rate by the high hydrogen solubility metal is not rate-limiting. Although the permeability of hydrogen through the second metal layer 13 does not rapidly occur, it is still adequate for forming a hydrogen containing first metal layer 12 in situ at useful rates, for example, under hydrogen pressures of less than about 1 atmosphere. For example, a pressure differential of 1 atmosphere is sufficient to diffuse hydrogen at a rate of about 0.8 micron-liters/min/$cm^2$ to about 12 micron-liters/min/$cm^2$ through a 10,000 Å thick copper metal layer at 400° C. and into a titanium layer. Assuming the conversion process is 100% efficient, this flux would yield about 20 Å to about 340 Å of a hydrogen saturated titanium layer/minute. In some instances, the hydrogen pressure may be increased to above 760 mm Hg (approximately 1 atmosphere) to accomplish the desired transfer of hydrogen through the second metal layer 13 and into the high hydrogen solubility metal without employing undesirably high temperatures or long exposure times. Typically, temperatures greater than about 600° C. and/or exposure times greater than about 300 minutes are generally undesirable. For example, in diffusing hydrogen through copper and into titanium as described above, increasing the hydrogen pressure differential by a factor of 10 may increase the rate of hydride formation proportionately. Alternatively, raising the temperature during formation of a hydrogen containing metal layer from about 400° C. to about 500° C. may increase the flow rate of hydrogen through copper over as much as 500%.

Therefore, according to the first hydrogen loading method, under a preselected temperature, hydrogen pressure and time conditions, hydrogen will penetrate the second metal layer 13 and form a hydrogen containing first metal layer 12. Once the hydrogen containing first metal layer 12 is formed, first and second metal layers 12 and 13 may be cooled to near room temperature, preferably about 50° C. to about 200° C., under a suitable pressure of hydrogen, preferably about 10 mm to about 760 mm. The structure including first and second metal layers 12 and 13 may then be stored under normal ambient conditions of room temperature and pressure.

In a second hydrogen loading method, the high hydrogen solubility metal is formed on the substrate assembly surface 30 and optionally patterned. The high hydrogen solubility metal is then hydrogenated to form the hydrogen containing first metal layer 12 prior to depositing the second metal layer 13. Generally, this second hydrogen loading process will incorporate hydrogen into the high hydrogen solubility metal at a faster rate than the first hydrogen loading process. For example, this process will typically require a time period in the range of about 0.1 minutes to about 30 minutes, at a temperature of about 20° C. to about 200° C. and a hydrogen pressure of about 10 mm to about 760 mm, depending on the selected high hydrogen solubility metal or metals selected for the first metal layer 12.

As formation of the hydrogen containing first metal layer 12 occurs prior to forming the second metal layer 13, care must be taken when forming the second metal layer 13 so as to prevent degradation of the first metal layer 12. For example, exceeding the hydrogen release temperature of the hydrogen containing first metal layer 12 during formation of the second metal layer 13 will undesirably result in hydrogen evolution from the hydrogen containing first metal layer 12.

Advantageously, regardless of the method employed for introducing hydrogen into the first metal layer 12, once formed, the hydrogen containing first metal layer 12 and the second metal layer 13 are stable under the conditions described above until heated to a temperature sufficient to release hydrogen from the first metal layer 12, i.e., hydrogen release temperature.

The high hydrogen solubility metal used for the first metal layer 12 may be formed by several methods known in the art. These methods include, but are not limited to, physical sputtering, evaporation and chemical vapor deposition such as metal-organic chemical vapor deposition (MOCVD). If a metal alloy is employed in the first metal layer 12, the alloy can be sputtered from an alloy source containing the prepared alloy at a temperature sufficient to produce a metal layer that has reproducible morphological properties, e.g., crystal structure, grain size and orientation of crystalites.

Second metal layer 13 is typically deposited on surface 32 of first metal layer 12 and at least a portion of the substrate assembly surface 30 by a variety of methods. As described above in reference to the first metal layer 12, the second metal layer 13 may also be formed by physical sputtering, evaporation and chemical vapor deposition, such as MOCVD. These deposition methods should employ conditions that minimize interfacial metal mixing.

Deformation of the Second Metal Layer

After formation of the first and second metal layers 12 and 13, the hydrogen containing first metal layer 12 is thermally treated. During thermal treatment of the hydrogen containing first metal layer 12, (e.g., thermal treatment to a hydrogen release temperature for the first metal layer 12 for a relatively short period of time, such as a few seconds to as much as a few minutes), hydrogen evolves from the first metal layer 12. Due to the low solubility of the hydrogen in the second metal layer 13, hydrogen is unable to substantially diffuse through the second metal layer 13 during the relatively short time period of the thermal treatment, and is trapped, at least temporarily, by the second metal layer 13. As such, deformation of the second metal layer 13 is achieved under a pressure generated by the trapped hydrogen.

As used herein, "deformation," refers generally to any displacement of any portion or all of the patterned or unpatterned second metal layer 13. For example, such deformations may be of any configuration, e.g., formed into a molded shape, entirely displaced from one position to another, curved, etc. One example of deformation employing a hydrogen containing titanium layer and a copper metal layer, is shown in Table 3 below, and is further described below with reference thereto.

As shown in FIG. 1B, thermal treatment of at least the hydrogen containing first metal layer 12 allows hydrogen to diffuse from the first metal layer 12 and form a raised conductive region 23 from the second metal layer 13 supported over a void region 18. After thermal treatment, the void region 18 positioned between the first metal layer 12 and the raised conductive region 23, typically contains hydrogen gas that has evolved from the first metal layer 12. The evolved hydrogen gas is usually only temporarily retained in the void region 18 and after formation of the void region 18, will begin to out-diffuse through the raised conductive region 23. However, as complete out-diffusion of hydrogen gas may not occur and some hydrogen gas may be retained in the void region 18, a gas-filled void region may be formed. Alternatively, the void region 18 may contain a vacuum that is essentially free from hydrogen gas.

To ensure plastic deformation of second metal layer 13, the hydrogen pressure burst resulting from the thermal treatment must first act to separate second metal layer 13 predictably from its interface with first metal layer 12 and surface 32 thereof. Although the low hydrogen solubility metals employed in the present invention are inert and typically adhere poorly to most surfaces, including other metals, additional measures may be taken, such as those described with reference to FIGS. 4A–4E, to ensure adequate separation of first metal layer 12 from second metal layer 13.

Depending on the metal or combination of metals selected to form the first metal layer 12 and the second metal layer 13, hydrogen will evolve from the first metal layer 12 in a time ranging from about 1 second to about 5 minutes. During this time period, evolved hydrogen from the hydrogen containing first metal layer 12, will be temporarily trapped and unable to diffuse through the second metal layer 13 providing the force necessary to deform the second metal layer 13. Preferably, the temperature of the thermal treatment is above the hydrogen release temperature for the hydrogen containing first metal layer 12, e.g., 400° C. for a titanium hydride layer. One skilled in the art will recognize that the time period and temperature of thermal treatment will vary depending upon the desired deformation, the hydrogen content of the metal layer 12, as well as the thickness, strength and modulus of metal layer 13 and their dependencies upon temperature. After thermal treatment, a metal layer 20 results in a layer which is essentially free from hydrogen. Typically, the essentially hydrogen free metal layer 20 remains on the substrate assembly surface 30. For example, if the first metal layer 12 is formed of titanium, the titanium will remain on the substrate surface 30.

Thermal treatment of the hydrogen containing first metal layer 12 can be accomplished by several methods. For example, thermal treatment may be accomplished by using a laser. Typically, the laser is localized on the structure containing the hydrogen containing first metal layer 12 and the second metal layer 13. The first and second metal layers 12 and 13 absorb energy from the laser generating heat that is sufficient to cause the evolution of hydrogen from the first metal layer 12 thereby causing deformation in the second metal layer 13. However, the energy required to heat and release hydrogen may also be provided by the use of a focused electron beam in a vacuum system, an intense beam of broad spectrum or monochromatic light with or without the use of antireflective coatings, or by heating in a suitable furnace.

Further, for example, a hydrogen containing first metal layer 12 may be thermally treated using a thin film heater. A thin film heater may be positioned or formed over the substrate assembly surface 30 containing the first and second metal layers 12 and 13. The thin film heater passes electric current from an area of high concentration to an area of low concentration. The electric current generated from the thin film heater is sufficient to cause the evolution of hydrogen from the first metal layer 12 thereby causing deformation in the second metal layer 13.

Alternatively, a heated mold may be used for thermal treatment of the hydrogen containing first metal layer 12. A heated mold is capable of controlling the dimensions of second metal layer 13 on substrate assembly surface, and providing heat sufficient to evolve hydrogen from the first metal layer 12. This embodiment is described further below with respect to FIGS. 3A–3B. It should be recognized by one of skill in the art, that any rapid thermal treatment suitable for evolving hydrogen from the hydrogen containing first metal layer 12 at a temperature and for a time period sufficient to cause deformation of the second metal layer 13 may be employed.

The deformation examples set forth in Table 3 below, demonstrate that a large variety of deflections in a second metal layer 13 may be achieved by evolving hydrogen from a titanium hydride first metal layer 12. Deflection of the second metal layer 13, such as to form raised conductive region 23, can further be described with reference to a low hydrogen solubility metal, such as copper or gold. Copper metal is known to have a moderate modulus of elasticity, excellent ductility (in excess of 50% elongation before fracture) and is capable of annealing rapidly in about 0.5 seconds to about 8.0 seconds, at temperatures of over 300° C. (approaching ½th the absolute melting point of that metal). Gold is softer and a more malleable metal than is copper metal. The moduli of copper and gold are respectively about 16 megapsi and about 12 megapsi at room temperature, and a third less over 300° C. Deformations of various conductive structure shapes under different loads can be estimated from classical mechanics.

For example, for a circular plate supported on its perimeter and subjected to a uniform pressure load, e.g., the configuration of FIGS. 2A–2B, the deformation ($S_{Max}$) is greatest at its center:

$$S_{Max} = \frac{2}{3E} \frac{R^4}{T^3} W \quad \text{(Eq. 1)}$$

where: W is the load (psi); E the modulus of elasticity (psi); and, R and T are the plate's radius (in) and thickness (in), respectively.

Substantial volumes of hydrogen can be evolved from a thin disk of a hydrogen containing first metal layer 12, e.g., $TiH_2$ source. Substantial volumes of hydrogen can be evolved from thin $TiH_2$ sources. To estimate the gas volumes and attendant copper deformations, it is assumed that: the in situ hydrogenation process converts a disk of titanium completely to $TiH_2$, and that upon thermal treatment, the titanium hydride liberates all retained hydrogen. Thus, any residual hydrogen present in solid solution after thermal treatment is "essentially free" from hydrogen.

Therefore, a disk of $TiH_2$ will liberate a quantity of hydrogen ($h_{H_2}$):

$$h_{H_2} = \frac{\pi R^2 p h}{M} \quad \text{(Eq. 2)}$$

where: R is the radius and h is the height of the disk; p is the density of $TiH_2$ (3.9 g/cc); and, M is its gram-molecular weight. The volume of hydrogen at Standard Temperature and Pressure (STP) is the product of and the Gas Constant, G=22,400 cc/gram-mole. To estimate gas volume-copper deformation tradeoffs, it is convenient to assume that the liberated hydrogen fills a cylindrical column of radius R and height H in which case:

$$H = \frac{G}{\pi R^2} \left[ \frac{\pi R^2 p h}{M} \right] = \frac{G p h}{M} \quad \text{(Eq. 3)}$$

A combination of Equations 1 and 3 can be used to estimate plate deflections from a given $TiH_2$ source. Take, for example, a copper plate having a thickness of about 0.1 micron and a radius of about 10 micron, a $TiH_2$ disk having a thickness of about 100 Å (0.1 micron) also with a radius of 10 micron. Equation 1 shows the deflection or deformation of the copper plate is proportional to pressure. The $TiH_2$ disk yields H=18 microns (at STP). Application of Charles' Law (pressure×volume=a constant) may be used to calculate the pressure dependence of the height (H) of the gas column. As such, at a pressure of 1.75 atmospheres, the deflection of the copper plate=gas column height (H)=10 microns. Accordingly, this indicates that the 0.1 micron $TiH_2$ source will cause a deflection of the copper of about 10 microns. A more accurate approximation takes into account that hydrogen will not fill a cylindrical shaped column of copper but rather a dome-shaped one such as shown in FIG. 2B. Accordingly, the hydrogen height is greater, e.g., by a factor of 1.5 if the dome were roughly hemispherical in shape. With this correction, the hydrogen will attain a pressure of about 2.1 atmosphere, sufficient to deflect the copper by about 12 micron.

Further, to show the variety of deformations possible, changes in T and h can produce a wide range of deformations in a plate of fixed R. Equations 3 and 4 can also be solved simultaneously to determine the pressure factor (P) required to equalize the gas column height (H) and the maximum deflection ($S_{max}$) under the resulting pressure:

$$S_{Max}^{STP} \cdot P = \frac{H^{STP}}{P} \quad \text{(Eq. 4)}$$

From Equation 4:

$$P = \sqrt{\frac{H^{STP}}{S_{Max}^{STP}}} \quad \text{(Eq. 5)}$$

Equation 5 can be used to estimate deflections expected for several cases, and the results are summarized in Table I below. Although the results are only estimates, they demonstrate that this method can produce a wide range of deformations that can be about 0.1 micron or less to over 1000 microns. Finally, as discussed above in reference to Tables 1 and 2, it is realized that the deformations described above may require pressures higher than indicated such that the deformation may in order to take place in times that are short compared to those needed for hydrogen to diffuse through the second metal layer 13. For example, the pressure adjustment can be made by suitably increasing the $TiH_2$ mass in the above example structure.

TABLE 3

| CU DIA. (microns) | CU THICK. (microns) | $TiH_2$ THICK. (microns) | MAX. DEFLECTION (microns) |
|---|---|---|---|
| 2.5 | 0.1 | 0.01 | 2.0 |
| 2.5 | 0.3 | 0.01 | 0.1 |
| 25 | 0.1 | 0.01 | 60 |
| 25 | 0.1 | 0.02 | 90 |

TABLE 3-continued

| CU DIA. (microns) | CU THICK. (microns) | TiH$_2$ THICK. (microns) | MAX. DEFLECTION (microns) |
|---|---|---|---|
| 25 | 0.3 | 0.01 | 21 |
| 25 | 0.3 | 0.02 | 30 |
| 25 | 0.5 | 0.01 | 6 |
| 25 | 0.5 | 0.02 | 9 |
| 2500 | 25 | 1.0 | 1170 |

*Examples of plate deformations for a round, copper plate having a modulus of elasticity, E = 16 megapsi using a round TiH$_2$ disc having the same diameter but different thickness.

Referring now to FIGS. 2A–2B, a conductive structure can be formed in a manner similar to that described with reference to FIGS. 1A–1B. In this embodiment, a clamping structure 35 is employed. A "clamping structure," as used herein, refers to and includes any structure used to secure at least a portion of a metal layer being deformed according to the present invention. For example, the clamping structure may be a perimeter clamping film (described with reference to FIGS. 2A–2B), or a mold (discussed with reference to FIGS. 3A–3B). Although the clamping structure 35 is described with particularity to FIGS. 2A–2B, it is to be appreciated that clamping structure 35 may optionally be employed in any of the embodiments described herein. For example, clamping structure 35 may be optionally employed when adhesion between the substrate assembly surface 30 and the second metal layer 33 is not adequate for holding a portion of the second metal layer 33 in place during deformation thereof.

As shown in FIGS. 2A–2B, a conductive structure is formed by providing a substrate assembly 14 having a substrate assembly surface 30. Formed on the substrate assembly surface 30 is a hydrogen containing first metal layer 31 having a first metal layer surface 32. As shown in FIG. 2A, first metal layer 31 is a patterned metal layer defined on a specific region of the substrate assembly surface 30. Further, a second metal layer 33 is formed on at least a portion of the first metal layer 31, and preferably over the entire first metal layer 31 and a portion of the substrate assembly surface 30.

Clamping structure 35 is typically employed where adhesion at regions between second metal layer 33, first metal layer 31 and/or substrate assembly surface 30 may be insufficient for holding a layer in place as described. In the embodiment illustrated in FIGS. 2A–2B, clamping structure 35 serves to attach at least a portion of a perimeter 39 of second metal layer 33, and preferably a portion about the entire perimeter of second metal layer 33, to the underlying layers. For example, clamping structure 35 contacts several surfaces including, upper surface regions 37 and 41 of the second metal layer 33, surface regions 38 of substrate assembly 14, and at lower surface regions 36 of clamping structure 35. Clamping structure 35 serves to control possible lateral penetration of hydrogen gas during thermal treatment of the hydrogen containing first metal layer 31, and deformation of the second metal layer 33 beyond the lower surface region 36 of clamping structure 35.

When a clamping structure 35 is employed, there are several metals and metal alloys that are suitable for serving as the clamping structure 35. The thickness of the clamping structure 35 required is dependent upon the clamping structure's strength and modulus relative to the strength and modulus of the metal film 33 in the temperature range selected for the deformation step. Such metals include, but are not limited to, aluminum, aluminum—copper alloy (e.g., aluminum—4% copper), tungsten, molybdenum, platinum. These metals provide good adhesion to substrate assembly surface 30 of substrate assembly 14, and are essentially impermeable to hydrogen. Additionally, these clamping structure metals typically do not form hydrides in the presence of hydrogen, and are thermally stable. Additionally, clamping structure 35 can be of any suitable configuration, i.e., size and/or shape.

As shown in FIGS. 2A and 2B, clamping structure 35 may function along with processes to optimize delamination of the second metal layer 33 from the substrate assembly surface 30 and first metal layer 42 during thermal treatment as further described below, e.g., use of a thin oxide layer. Although a single clamping structure 35 is shown, it may be desirable to have multiple clamping structures on a single substrate assembly 14, or a clamping structure 35 capable of attaching multiple perimeters of second metal layers 33 to underlying layers. Regardless of the clamping structure 35 or structures employed in the present invention, clamping structure 35 offers considerable advantages in determining the dimensions of second metal layer 33. These advantages include, but are not limited to, (a) compensating for incomplete formation of the hydrogen containing first metal layer 31 and hydrogen evolution (for example, ⅟50th to ½ of the hydrogen stored in metal layer 32 might be retained after the hydrogen evolution step as a result of the back pressure developed due to the inability of hydrogen to diffuse through the metal layer 33 in the time and at the temperature used to evolve it), (b) raising hydrogen pressures to achieve desired second metal layer 33 deformation rates if necessary, (c) produce a variety of desired second metal layer 33 deformations across the substrate surface 30 using a single, uniform thermal treatment, and (d) alternately, permitting the inside dimensions of the clamping structure 35 to be altered to yield various second metal layer 33 deformations.

As shown in FIG. 2B, thermal treatment of at least the hydrogen containing first metal layer 31 allows at least some portion, preferably most of the hydrogen gas to diffuse rapidly out of the hydrogen containing first metal layer 31 to form a raised conductive region 47 from second metal layer 33 supported over a void region 50 with part of the second metal layer 33 retained in position by clamping structure 35. Raised conductive region 47 is thus a result of deformation of second metal layer 33. After thermal treatment, first metal layer 42 is essentially free from hydrogen and typically remains on the substrate assembly surface 30.

Figure 3A:
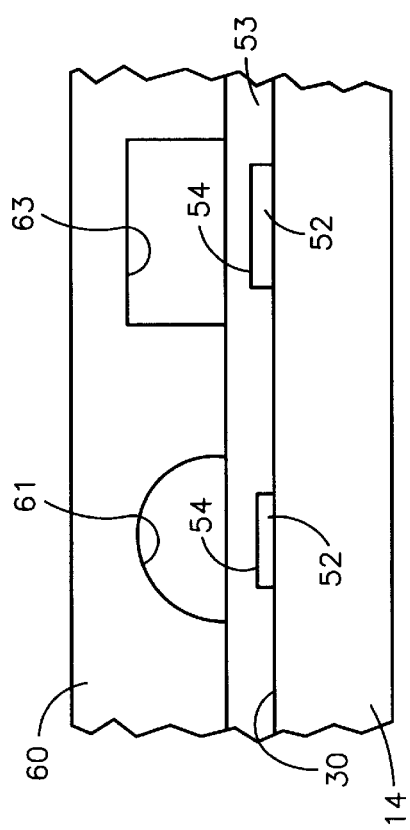

Referring to another embodiment of the method of the invention shown in FIGS. 3A and 3B, a conductive structure can be formed using a mold 60 having mold surfaces 61 and 63. In a manner similar to that described with reference to FIGS. 1A–1B, a conductive structure is formed by providing a substrate assembly 14 having a substrate assembly surface 30. Formed on the substrate assembly surface 30 is a hydrogen containing first metal layer 52 having a first metal layer surface 54. The first metal layer 52 is a patterned metal layer. Further, a second metal layer 53 is formed on at least a portion of the first metal layer 52.

Mold 60, in a manner similar to that described above with regard to clamping structures in general, is typically employed to control vertical and lateral dimensions of second metal layer 53, e.g., vertical and horizontal dimension, on substrate assembly surface 30. In other words, mold 60 is used to shape the second metal layer 53 into a desired configuration. First metal layer 52, as described above, is preferably saturated with hydrogen prior to thermal treatment by mold 60.

As described above, mold 60 may be a heated mold to provide both heat for thermal treatment of the hydrogen containing first metal layer 52 and to provide mold surfaces 61 and 63 for formation of raised conductive regions 67 and 68 over void regions 80 and 81, respectively, in the desired shapes. It is not necessary to pattern the hydrogen containing first metal layer 52 (as shown). Upon the evolution of hydrogen from the hydrogen containing first metal layer 52, heated mold 60 can both shape the deformations of second metal layer 53 by heated mold surfaces 61 and 63 and serve to prevent film delamination of the second metal layer 53 from the underlying layers. Depending on the specific heated mold 60 selected, a variety of deformation sizes can be achieved. For example, the deformations shown in FIG. 3B are spherical and rectangular in shape. After thermal treatment, first metal layer 72 is essentially free from hydrogen and, as stated above, typically remains on the substrate assembly surface 30.

Referring to FIGS. 4A–4E, a conductive structure 170 is formed according to another embodiment of the invention. In this embodiment, one or more additional layers are provided to further ensure separation of the second metal layer 150 from first metal layer surface 104 of the hydrogen containing first metal layer 102 during deformation of second metal layer 150. As stated above, upon thermal treatment, a pressure burst of hydrogen gas from the hydrogen containing first metal layer 102, serves to separate second metal layer 150 predictably from its interface with first metal layer surface 104. Adhesion between the first metal layer 102 and the second metal layer 150 can be reduced and/or controlled to enhance the separation between the first metal layer 102 and the second metal layer 150 by inclusion of the one or more additional layers described below.

First, a thin oxidized layer 120 having an oxidized layer surface 122 can be formed on surface 104 of the hydrogen containing first metal layer 102 as shown in FIG. 4B. The oxidized layer 120 may be about 1 Å to about 20 Å in thickness, preferably about 3 Å to about 10 Å in thickness. Preferably, the oxidized layer 120 is formed by oxidizing the first metal layer surface 104 at room temperature via a controlled exposure to oxygen. The thin oxidized layer 120 typically does not represent a barrier to hydrogen absorption into the first metal layer 102. The oxidized layer 120 is typically employed to reduce adhesion between the first metal layer surface 140 and the second metal layer 150. Upon thermal treatment, the oxidized layer 120 is typically completely dissolved into the first metal layer 102.

The oxidized layer 120 may be formed during the formation of the first metal layer 102. For example, at a temperature of about 200° C. or less, during formation of many high solubility metals, oxide growth may occur to a thickness of about 10 Å to about 200 Å.

Referring to FIG. 4C, a carbon layer 130 having a carbon layer surface 132 is formed on the oxidized layer surface 122 to further reduce the adhesion between the first metal layer 102 and the second metal layer 150. Preferably, the carbon layer 130 is deposited by physical sputtering from a carbon source and is about 1 Å to about 25 Å in thickness, more preferably about 5 Å to about 20 Å in thickness.

It is to be appreciated that to reduce adhesion between the first metal layer 102 and the second metal layer 150, either of the above described techniques, i.e., an oxidized layer 120 alone or an oxidized layer 120 in combination with a carbon layer 130, may be used to reduce adhesion. Additionally, an electrodepositing method for forming the second metal layer 150 may be used to further enhance such adhesion reducing techniques. The electrodepositing method technique typically includes forming a seed layer 140 on either the oxidized layer 120 and/or the carbon layer 130 by electrodeless deposition as shown in FIG. 4D. Thereafter, the second metal layer 150 is electro-deposited on the seed layer 140 as shown in FIG. 4D. For example, a seed layer 140 having a seed layer surface 141 may be deposited on the carbon layer surface 132. The seed layer 140 may be formed, for example, by vacuum deposition. Vacuum deposition is typically accomplished by evaporation from a thermally-heated source or by physical sputtering of the metal source. Seed layer 140 is preferably formed of the same metal as the second metal layer 150. Preferably, seed layer 140 is about 3 Å to about 50 Å in thickness, and more preferably about 5 Å to about 20 Å in thickness. Finally, the second metal layer 150 may be deposited on the seed layer surface 141 by electrodeposition. For example, to electroplate copper metal, the surface portion to be plated is typically immersed in an electrolytic cell containing a copper rod which is subsequently used as an anode to replace copper ions in solution. These copper ions are then plated on the copper seed layer which is biased negatively and serves as the cathode. The amount of copper plated is controlled by the amount of electrical current passed through the electrolytic cell, the chemical composition, and the geometry, etc., as is known to one skilled in the art.

As shown in FIG. 4E, thermal treatment of at least the hydrogen containing first metal layer 102 allows hydrogen to diffuse rapidly out of the hydrogen containing first metal layer 102 to form a raised conductive region 170 from the second metal layer 150 supported over a void region 176. Raised conductive region 170 is thus a result of deformation of the second metal layer 150. After thermal treatment, first metal layer 160 is essentially free from hydrogen and typically remains on the substrate assembly surface 30.

Figure 5B:
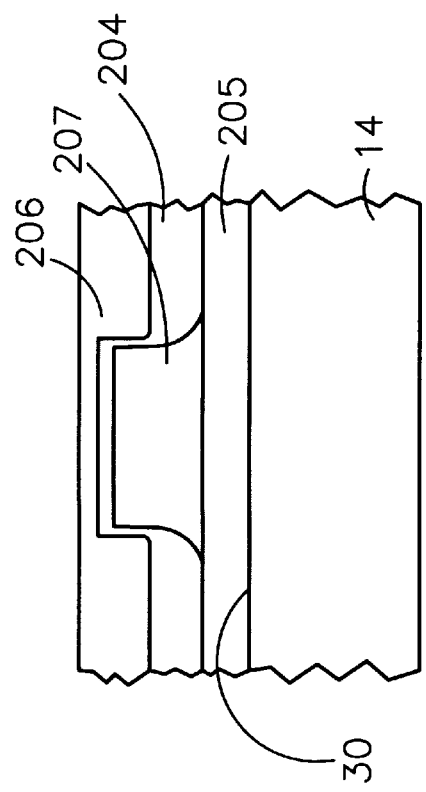
FIGS. 5A–5B are diagrammatic views of additional embodiments of the present invention illustrating the thermal treatment employed for forming conductive structures according to the present invention.
Figure 5A:
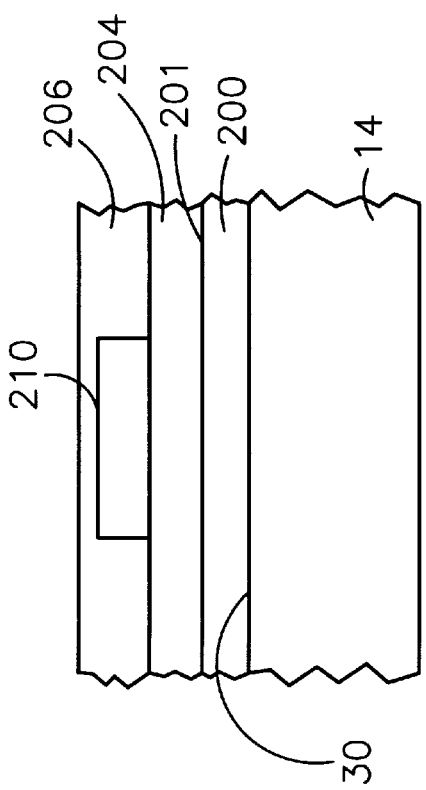

Referring to FIGS. 5A–5B, thermal treatment using a heated mold is illustrated for forming a conductive structure according to the present invention. In this embodiment, an unpatterned first metal layer 200 having a first metal layer surface 201 is formed on substrate assembly surface 30 of substrate assembly 14. The first metal layer 200, as described in reference to FIGS. 1A–1B, is preferably a hydrogen containing first metal layer 200. Second metal layer 204 is provided over at least a portion of first metal layer surface 201. Depending on the selected heated mold 206, a variety of deformation sizes can be achieved. For example, the deformation shown in FIG. 5B is rectangular in shape. As described with reference to FIGS. 3A and 3B, heated mold 206 serves to provide both heat, for thermal treatment, and a mold surface 210 for shaping raised conductive region 207.

Figure 6B:
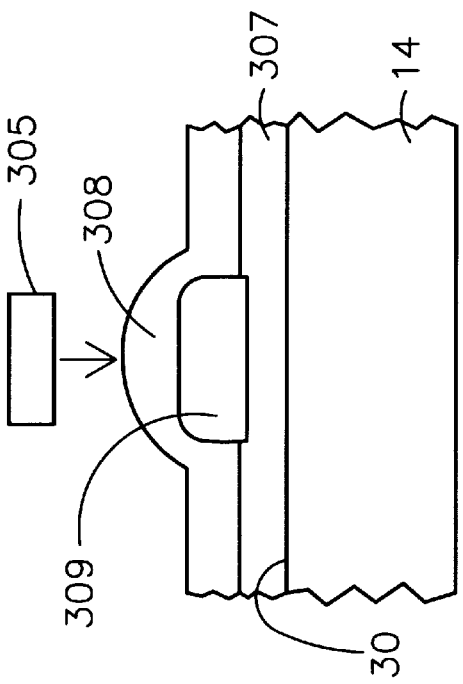
FIGS. 6A–6B are diagrammatic views illustrating another thermal treatment method used to form conductive structures according to the present invention.
Figure 6A:
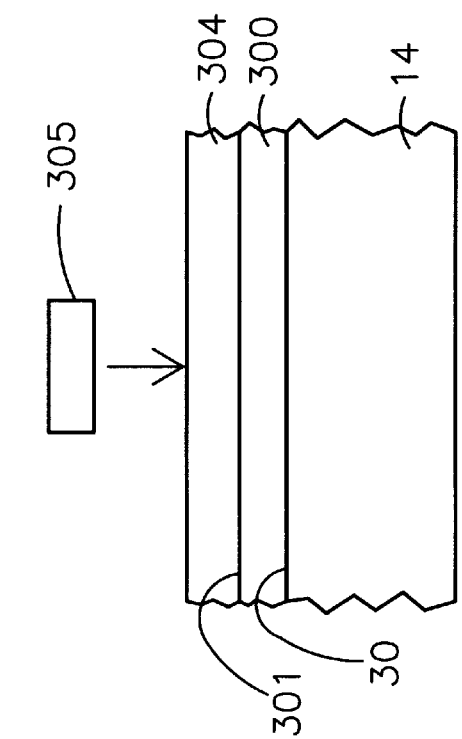

Referring now to FIGS. 6A–6B, thermal treatment using a laser 305 is illustrated forming a conductive structure according to the present invention. In this embodiment, an unpatterned first metal layer 300 having a first metal layer surface 301 is formed on substrate assembly surface 30 of substrate assembly 14. The first metal layer 300, as described with reference to FIGS. 1A–1B, is preferably a hydrogen containing first metal layer 300. Second metal layer 304 is provided over first metal layer surface 301 of the hydrogen containing first metal layer 300.

Thermal treatment by laser 305 of at least the hydrogen containing first metal layer 300, allows hydrogen to diffuse rapidly out of the first metal layer 300 and form a raised conductive region 308 from second metal layer 304 supported over a void region 309. Raised conductive region 308 is thus a result of deformation of second metal layer 304 by laser 305 which can advantageously localize the heat to desired regions of the hydrogen containing first metal layer 301.

Although the invention has been described with particular reference to various embodiments thereof, variations and modifications of the present invention can be made within the contemplated scope of the following claims as is readily known to one skilled in the art.

What is claimed is:

1. A method for forming a conductive structure comprising:
   providing a substrate assembly having a surface;
   forming at least one hydrogen containing first metal layer on the substrate assembly surface;
   forming a second metal layer on at least a portion of the first metal layer; and
   thermally treating at least the first metal layer to deform at least a portion of the second metal layer.

2. The method of claim 1, wherein thermally treating at least the first metal layer includes deforming at least a portion of the second metal layer by a diffusion of hydrogen gas out of the hydrogen containing first metal layer.

3. The method of claim 1, wherein forming the at least one hydrogen containing first metal layer includes; forming a layer of at least one high hydrogen solubility metal; and incorporating hydrogen in the high hydrogen solubility metal layer.

4. The method of claim 3, wherein forming the at least one hydrogen containing first metal layer includes forming a metal hydride layer.

5. The method of claim 3, wherein incorporating hydrogen into the high hydrogen solubility metal layer includes incorporating hydrogen into the high hydrogen solubility metal layer by diffusion through the second metal layer.

6. The method of claim 3, wherein incorporating hydrogen into the high hydrogen solubility metal layer includes incorporating hydrogen into the high hydrogen solubility metal layer by exposing the high hydrogen solubility metal layer to a hydrogen atmosphere.

7. The method of claim 3, wherein the high hydrogen solubility metal is at least one metal selected from the group of titanium, zirconium, thorium, hafnium, vanadium, niobium, tantalum, lanthanum, cerium, and palladium.

8. The method of claim 3, wherein forming the second metal layer on at least a portion of the first metal layer includes using one or more low hydrogen solubility metals.

9. The method of claim 8, wherein the low hydrogen solubility metal is at least one metal selected from the group of copper, silver, gold, tungsten, platinum, aluminum, molybdenum, iron and nickel.

10. The method of claim 8, wherein the high hydrogen solubility metal has a hydrogen permeability of about 4 or more orders of magnitude greater than a hydrogen permeability of the low hydrogen solubility metal.

11. The method of claim 1, wherein thermally treating the first metal layer is performed at a temperature greater than the hydrogen release temperature for the first metal layer for a time period less than about 10 minutes.

12. The method of claim 1, wherein forming the at least one hydrogen containing first metal layer includes forming an unpatterned metal layer.

13. The method of claim 12, wherein thermally treating the first metal layer includes thermally treating the unpatterned metal layer using a laser.

14. The method of claim 12, wherein thermally treating at least the first metal layer includes thermally treating the unpatterned metal layer using a heated mold.

15. The method of claim 1, wherein forming the at least one hydrogen containing first metal layer includes forming a patterned hydrogen containing first metal layer.

16. The method of claim 1, wherein thermally treating the first metal layer includes thermally treating the first metal layer using a laser.

17. The method of claim 1, wherein thermally treating the first metal layer includes thermally treating the first metal layer using a thin film heater.

18. The method of claim 1, wherein thermally treating the first metal layer includes thermally treating the first metal layer using a heated mold.

19. A method for forming a conductive structure comprising:
    providing a substrate assembly having a surface;
    forming at least one hydrogen containing first metal layer on the substrate assembly surface;
    forming a second metal layer on at least a portion of the first metal layer;
    providing a clamping structure positioned over at least a portion of the second metal layer; and
    thermally treating at least the first metal layer to deform at least a portion of the second metal layer.

20. The method of claim 19, wherein providing the clamping structure includes providing a clamping structure positioned on at least a portion of a perimeter of the second metal layer.

21. The method of claim 19, wherein providing the clamping structure includes providing a heated mold positioned over at least a portion of the second metal layer.

22. The method of claim 21, wherein forming the at least one hydrogen containing first metal layer includes forming the at least one hydrogen containing first metal layer using a high hydrogen solubility metal.

23. The method of claim 22, wherein forming the second metal layer on at least a portion of the first metal layer includes forming the second metal layer using a low hydrogen solubility metal.

24. The method of claim 19, wherein providing the clamping structure includes providing a clamping structure formed at least on a portion of the second metal layer and a portion of the substrate assembly surface.

25. The method of claim 19, wherein thermally treating at least the first metal layer includes deforming at least a portion of the second metal layer by a diffusion of hydrogen gas out of the hydrogen containing first metal layer.

26. The method of claim 19, wherein thermally treating the first metal layer is performed at a temperature greater than the hydrogen release temperature for the first metal layer for a time period less than about 10 minutes.

27. The method of claim 19, wherein forming the at least one hydrogen containing first metal layer includes forming an unpatterned metal layer.

28. The method of claim 19, wherein forming the at least one hydrogen containing first metal layer includes forming a patterned metal layer.

29. The method of claim 19, wherein the clamping structure is a clamping structure comprising a low hydrogen solubility metal.

30. The method of claim 29, wherein the metal is at least one metal selected from the group of aluminum, an aluminum-copper alloy, tungsten, molybdenum and platinum.

31. A method for forming a conductive structure comprising:
    providing a substrate assembly having a surface;
    forming at least one hydrogen containing first metal layer on the substrate assembly surface;
    forming a second metal layer on at least a portion of the first metal layer;

providing a mold positioned relative to a portion of the second metal layer, wherein the mold includes at least one mold surface; and thermally treating at least the first metal layer to deform at least a portion of the second metal layer into a structure corresponding to the at least one mold surface.

32. The method of claim 31, wherein thermally treating at least the first metal layer includes deforming at least a portion of the second metal layer by a diffusion of hydrogen gas out of the hydrogen containing first metal layer.

33. The method of claim 31, wherein forming the at least one hydrogen containing first metal layer includes forming the at least one hydrogen containing first metal layer using a high hydrogen solubility metal.

34. The method of claim 33, wherein forming the second metal layer on at least a portion of the first metal layer includes forming the second metal layer using a low hydrogen solubility metal.

35. The method of claim 31, wherein the mold is a heated mold, and further wherein thermally treating at least the first metal layer includes thermally treating the first metal layer using the heated mold.

36. A method for forming a void region associated with a substrate assembly, the method comprising:

providing a substrate assembly having a surface;

forming at least one hydrogen containing first metal layer on the substrate assembly surface;

forming a second metal layer on at least a portion of the first metal layer; and thermally treating at least the first metal layer to define a void between at least a portion of the substrate assembly surface and a portion of the second metal layer.

37. The method of claim 36, wherein forming the at least one hydrogen containing first metal layer includes forming the at least one hydrogen containing first metal layer using a high hydrogen solubility metal.

38. The method of claim 37, wherein forming the second metal layer on at least a portion of the first metal layer includes forming the second metal layer using a low hydrogen solubility metal.

39. The method of claim 38, wherein the high hydrogen solubility metal has a hydrogen permeability of about 4 or more orders of magnitude greater than a hydrogen permeability of the low hydrogen solubility metal.

40. The method of claim 36, wherein the void is a vacuum.

41. The method of claim 36, wherein the void is gas-filled.

42. The method of claim 36, wherein thermally treating the at least first metal layer is performed at a temperature greater than the hydrogen release temperature for the first metal layer for a time period less than about 10 minutes.

43. The method of claim 36, wherein forming the at least one hydrogen containing first metal layer includes forming an unpatterned metal layer.

44. The method of claim 36, wherein forming the at least one hydrogen containing first metal layer includes forming a patterned metal layer.

45. A method for forming a conductive structure comprising:

providing a substrate assembly having a surface;

forming at least one hydrogen containing patterned first metal layer on the substrate assembly surface;

forming a second metal layer on at least a portion of the patterned first metal layer; and thermally treating at least the patterned first metal layer to deform at least a portion of the second metal layer.

46. The method of claim 45, wherein thermally treating at least the patterned first metal layer includes thermally treating at least the patterned first metal layer using a laser.

47. The method of claim 45, wherein thermally treating at least the patterned first metal layer includes thermally treating at least the patterned first metal layer using a thin film heater.

48. The method of claim 45, wherein thermally treating at least the patterned first metal layer includes thermally treating at least the patterned first metal layer using a heated mold.

49. A method for forming a conductive structure comprising:

providing a substrate assembly having a surface;

forming at least one hydrogen containing unpatterned first metal layer on the substrate assembly surface;

forming a second metal layer on at least a portion of the unpatterned first metal layer; and thermally treating at least the unpatterned first metal layer to deform at least a portion of the second metal layer.

50. The method of claim 49, wherein thermally treating at least the unpatterned first metal layer includes thermally treating at least the unpatterned first metal layer using a laser.

51. The method of claim 49, wherein thermally treating at least the unpatterned first metal layer includes thermally treating at least the unpatterned first metal layer using a thin film heater.

52. The method of claim 49, wherein thermally treating at least the unpatterned first metal layer includes thermally treating at least the unpatterned first metal layer using a heated mold.

53. A method for forming a conductive structure comprising:

providing a substrate assembly having a surface;

forming at least one hydrogen containing first metal layer on at least a portion of the substrate assembly surface;

oxidizing at least a portion of the at least one hydrogen containing first metal layer resulting in an oxidized layer;

forming a second metal layer on at least a portion of the oxidized layer; and thermally treating at least the first metal layer to deform at least a portion of the second metal layer.

54. The method of claim 53, wherein oxidizing at least a portion of the hydrogen containing first metal layer results in an oxidized layer having a thickness of about 1 angstrom to about 20 angstroms.

55. The method of claim 53, wherein the method further comprises forming a carbon layer on at least a portion of the oxidized layer.

56. The method of claim 55, wherein forming the carbon layer results in a carbon layer having a thickness of about I angstrom to about 25 angstroms.

57. The method of claim 55, wherein forming the second metal layer includes forming a seed metal layer of a low hydrogen solubility metal on the oxidized layer.

58. The method of claim 57, wherein forming the second metal layer further includes electrodepositing the low hydrogen solubility metal on the seed metal layer.

59. The method of claim 53, wherein forming the second metal layer includes forming a seed metal layer of a low hydrogen solubility metal on the oxidized layer.

60. The method of claim 59, wherein forming the second metal layer further includes electrodepositing the low hydrogen solubility metal on the seed metal layer.

61. A conductive structure, the conductive structure comprising:

a substrate assembly having a surface;

a high hydrogen solubility metal on at least a portion of the substrate assembly surface; and a raised conductive region comprising a low hydrogen solubility metal, wherein at least a portion of the high hydrogen solubility metal and low hydrogen solubility metal are separated by a void region.

62. The conductive structure of claim 61, wherein the void region is a vacuum.

63. The conductive structure of claim 61, wherein the void region is gas-filled.

64. The conductive structure of claim 61, wherein the high hydrogen solubility metal has a hydrogen permeability of about 4 or more orders of magnitude greater than a hydrogen permeability of the low hydrogen solubility metal.

* * * * *

UNITED STATES PATENT AND TRADEMARK OFFICE
CERTIFICATE OF CORRECTION

PATENT NO.: 6,121,131
DATED: September 19, 2000
INVENTOR(S): Eldridge

It is certified that error appears in the above-identified patent and that said Letters Patent is hereby corrected as shown below:

[56]  References Cited

Delete "Sing et al." and insert --Singh et al--.

Column 9, line 37, delete "Deformation of the Second Metal Layer" and insert --Deformation of the Second Metal Layer--.

Column 17, line 21, after "includes" delete ";" and insert --:--.

Column 20, line 54, delete "I" and insert --1--.

Signed and Sealed this

Twenty-second Day of May, 2001

Attest:

NICHOLAS P. GODICI

Attesting Officer      Acting Director of the United States Patent and Trademark Office